US010242912B2

(12) United States Patent
Ventola et al.

(10) Patent No.: US 10,242,912 B2
(45) Date of Patent: Mar. 26, 2019

(54) INTEGRATED DEVICE DIES AND METHODS FOR SINGULATING THE SAME

(71) Applicant: ANALOG DEVICES, INC., Norwood, MA (US)

(72) Inventors: Craig Ventola, Groveland, MD (US);
Robert O. Doherty, Chelsea, MA (US);
Jose A. Santana, Leicester, MA (US);
John A. McHatton, North Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/625,122

(22) Filed: Jun. 16, 2017

(65) Prior Publication Data

US 2018/0012803 A1    Jan. 11, 2018

Related U.S. Application Data

(60) Provisional application No. 62/360,187, filed on Jul. 8, 2016.

(51) Int. Cl.
*H01L 21/304*    (2006.01)
*H01L 21/78*    (2006.01)
*H01L 23/544*    (2006.01)

(52) U.S. Cl.
CPC ............ *H01L 21/78* (2013.01); *H01L 23/544* (2013.01); *H01L 21/304* (2013.01); *H01L 2223/5446* (2013.01)

(58) Field of Classification Search
CPC ...................................................... H01L 21/304
USPC ............................................................ 257/776
See application file for complete search history.

(56) References Cited

U.S. PATENT DOCUMENTS

| | | | |
|---|---|---|---|
| 4,721,977 A | 1/1988 | Fukae | |
| 4,814,296 A * | 3/1989 | Jedlicka | B27G 19/10 148/DIG. 28 |
| 4,900,283 A | 2/1990 | Fukae | |
| 5,003,374 A * | 3/1991 | Vokoun, III | H01L 21/3043 174/255 |
| 5,219,796 A * | 6/1993 | Quinn | H01L 21/304 148/DIG. 28 |
| 6,046,101 A | 4/2000 | Dass et al. | |
| 6,271,102 B1 * | 8/2001 | Brouillette | B23D 59/002 257/E21.518 |
| 6,281,047 B1 | 8/2001 | Wu et al. | |
| 6,915,795 B2 | 7/2005 | Brouillette et al. | |
| 7,517,726 B1 * | 4/2009 | Tan | H01L 21/56 257/678 |
| 8,258,041 B2 | 9/2012 | Raghavan et al. | |
| 2004/0043535 A1 * | 3/2004 | Jeung | H01L 23/3114 438/109 |
| 2006/0001144 A1 * | 1/2006 | Uehling | H01L 23/585 257/690 |
| 2008/0003720 A1 * | 1/2008 | Lu | H01L 21/50 438/113 |

(Continued)

*Primary Examiner* — George Fourson, III
(74) *Attorney, Agent, or Firm* — Knobbe, Martens, Olson & Bear, LLP

(57) ABSTRACT

Integrated device dies and methods for forming one or more of the integrated device dies are disclosed. The integrated device dies can be formed using two step sawing process; a first sawing step partially sawing a substrate comprising metal and a second sawing step sawing through a remaining thickness of the substrate.

20 Claims, 8 Drawing Sheets

(56) References Cited

U.S. PATENT DOCUMENTS

| | | | |
|---|---|---|---|
| 2009/0026620 A1* | 1/2009 | Ohta | H01L 21/4857 |
| | | | 257/758 |
| 2010/0072635 A1* | 3/2010 | Kuo | H01L 21/78 |
| | | | 257/797 |
| 2010/0096730 A1 | 4/2010 | Stacey | |
| 2011/0175188 A1* | 7/2011 | Bui | H01L 31/035281 |
| | | | 257/443 |
| 2011/0309373 A1 | 12/2011 | Sharma et al. | |
| 2017/0256509 A1* | 9/2017 | Lee | H01L 21/6836 |

* cited by examiner

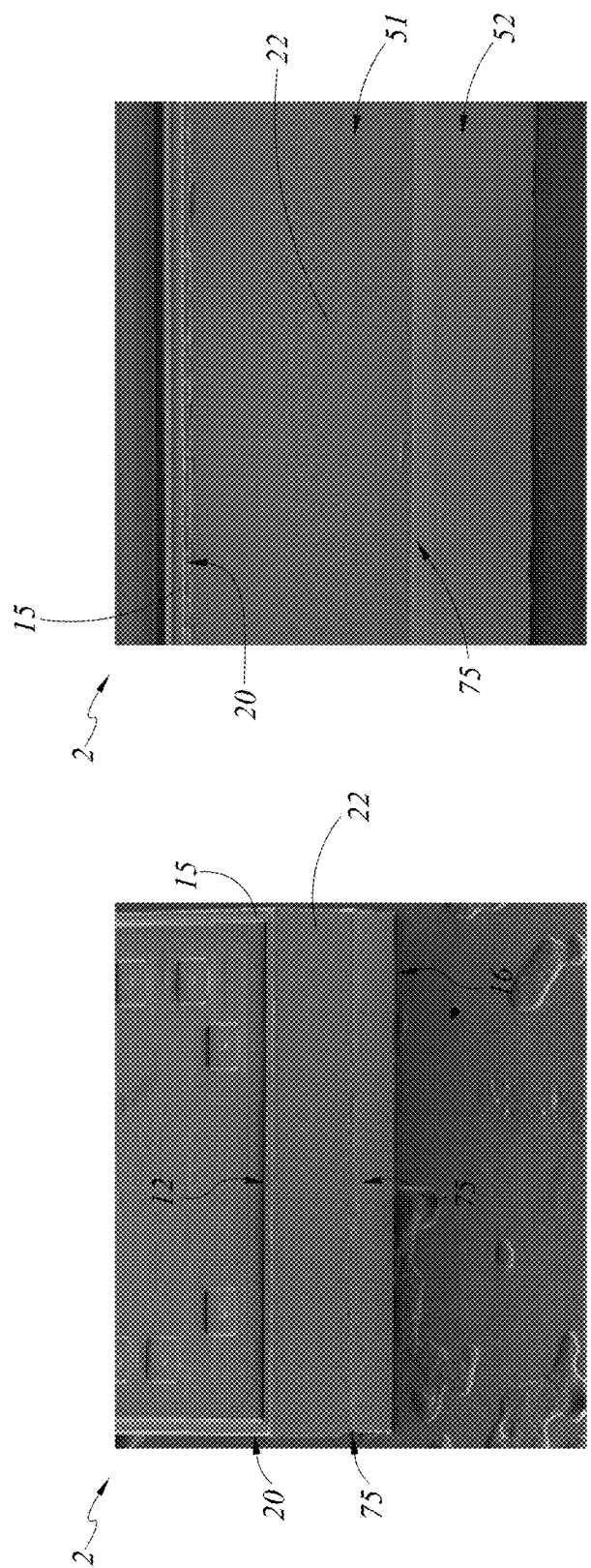

INTEGRATED DEVICE DIES AND METHODS FOR SINGULATING THE SAME

CROSS-REFERENCE TO RELATED APPLICATIONS

This application claims priority to U.S. Provisional Patent Application No. 62/360,187, filed Jul. 8, 2016, the entire contents of which are hereby incorporated by reference herein in their entirety and for all purposes.

BACKGROUND

Field

The field relates generally to reduced-stringer integrated device dies and methods for forming the same.

Description of the Related Art

During fabrication of integrated device dies, a substrate (e.g., a wafer) is typically diced to form a plurality of separated integrated device dies. For example, in various arrangements, the substrate can be sawn using any suitable type of saw, such as a diamond-bladed saw, etc. However, sawing through the substrate may damage the substrate and the associated integrated device dies, reducing the overall yield of integrated devices per substrate. Accordingly, there remains a continuing need for improved singulation methods to improve device yield.

SUMMARY

In one aspect, a method for forming one or more integrated device dies from a substrate having a first integrated device cell is disclosed. The first and second integrated device cells are delimited by a saw street. The saw street is comprising metal. The method can include partially sawing through the substrate at a first depth along the saw street from one side of the substrate. The method can further include sawing through a remaining thickness of the substrate from an opposite side of the substrate along the saw street to physically separate the first integrated device cell and the second integrated device cell.

In another aspect, an integrated device die is disclosed. The integrated device die can include a semiconductor substrate that has active circuitry at or near an active side of the integrated device die. The integrated device die can also include a metal structure disposed on a side edge of the semiconductor substrate at or near the active side of the integrated device die. The side edge comprises a first side edge and a second side edge. The side edge comprises a side saw marking defining a transition region between the first side edge and the second side edge.

BRIEF DESCRIPTION OF THE DRAWINGS

Embodiments will now be described with reference to the following drawings, which are provided by way of example, and not limitation.

FIG. 3E is a scanning electron micrograph illustrating a perspective side view of an integrated device die formed by a two-sided sawing process.

FIG. 3F is a scanning electron micrograph illustrating a magnified side view of the integrated device die of FIG. 3E.

DETAILED DESCRIPTION

Various embodiments disclosed herein relate to methods for forming integrated device dies with improved device yield. In various integrated device processing techniques, metal can be provided on the active surface of the substrate (e.g., a semiconductor wafer) to protect the bond pads from corrosion. For example, during substrate singulation, water or other liquids can be supplied to the substrate to remove debris and/or to reduce friction between the saw blades and the substrate. However, the water or other liquids may also act as an electrolyte that causes electromigration of the metal in the bond pads, which can corrode the bond pads and reduce device yield. To address the electromigration of metal from the bond pads during singulation and/or other processing steps, metal can be provided on the wafer, including across saw streets, to act as a sacrificial anode to prevent corrosion of the bond pads. Such traces can serve as a sacrificial anode, because, for example, metal from the traces, instead of metal from the bond pads, can be eroded to protect the bond pads. In one example, the metal can be routed in grid pattern following the pattern of the saw streets. In various embodiments, the metal can be provided at or near the active surface of the die.

The presence of the metal in the saw streets, however, can cause mechanical problems during the dicing operation. In typical singulation processes, a saw cut is made from the active surface of the substrate. When the saw cut passes through metal, ends of the metal are exposed in the saw street. In a single cut dicing operation, the same saw can continue through the wafer, but the surface metal tends to stick to the blade to the extent that saw's ability to cut is compromised, and continued downward action of the saw can cause cracking and damage to the dies. In a dual cut dicing operation, an initial cut can be a partial cut by a first saw, forming a groove through the active surface, followed by a second saw cut (which may be made with the same blade width or a different blade width from the first saw cut) from the same active surface to completely saw through the substrate. However, the interaction of the saw with the exposed metal ends during the second saw cut may create metal stringers (i.e., strips of metallic material) that hang from the singulated edges of the die. For example, during the second saw cut, the ends of the metal may be cantilevered such that the passing saw blade lifts the metal ends and warps them. The resulting ends of the die include jagged metal stringers, which can dangle onto active circuitry and/or short out the device circuitry.

Figure 1:
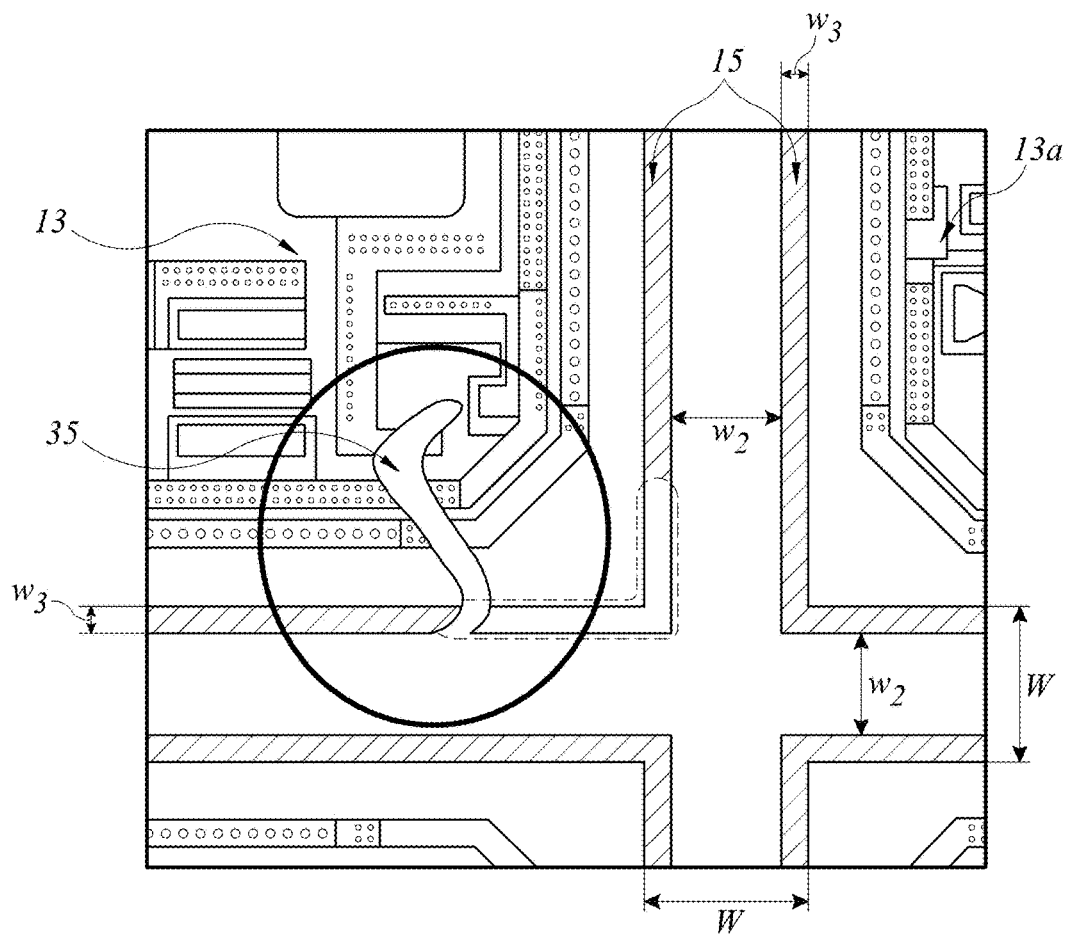
FIG. 1 is a top plan view of four adjacent integrated device cells that have been singulated by a sawing process.

For example, FIG. 1 is a top plan view of adjacent integrated device cells 13, 13a that have been singulated by a dual cut sawing process with both cuts from the same side. As shown in FIG. 1, for example, a metallic strip 15 having an overall strip width W can be disposed about the periphery of the device cells 13, 13a overlapping with the saw streets. A strip width $w_3$ can represent the lateral width of metal remaining on each side of the saw cut after singulation, although of course that width can differ on either side. When the second saw cut passes the exposed metal ends of the metal strip 15, the metal ends can be ripped outwardly from the device cells 13, 13a to form a stringer 35 as shown in FIG. 1. The stringer 35 can be undesirable, as it can fall down onto the circuitry of the device cells 13, 13a and can short out or otherwise damage the device cells 13, 13a. In some embodiments, the stringer 35 can be especially undesirable when the stringer 35 has a length of 90 microns or more, or 100 microns or more. Relatively long stringers 35 (e.g., stringers having a length of 100 microns or more) can increase the chance that the stringer 35 makes contact with the circuitry of the device cells 13, 13a.

Accordingly, various embodiments disclosed herein enable the singulation of integrated devices with reduced stringers. FIG. 2A is a schematic top plan view of a substrate 1 (e.g., a semiconductor wafer) having a plurality of integrated device cells 13, each of which includes one of the dies to be formed after singulation, delimited by a plurality of saw streets 11. The substrate 1 described herein can include deposited layers in addition to the bulk semiconductor material (e.g., silicon). The substrate 1 can have a first side 12 (for example, front side) and a second side 16 (for example, backside, see FIG. 3A) opposite the first side 12. In the illustrated embodiment, active components (e.g., active circuitry) may be formed at or near the first side 12 of the substrate 1. The substrate 1 shown in FIGS. 2A-2B comprises a semiconductor wafer (such as a silicon wafer), but other suitable types of substrates may be used with the embodiments disclosed herein. Moreover, the integrated device cells 13 can comprise any suitable type of device cell, and can include active processing circuitry (e.g., transistors) for use in integrated circuit applications (e.g., for an Application-Specific Integrated Circuit), moveable mechanical components (such as microelectromechanical systems, or MEMS, components), or any other suitable type of active or passive components.

Figure 2B:
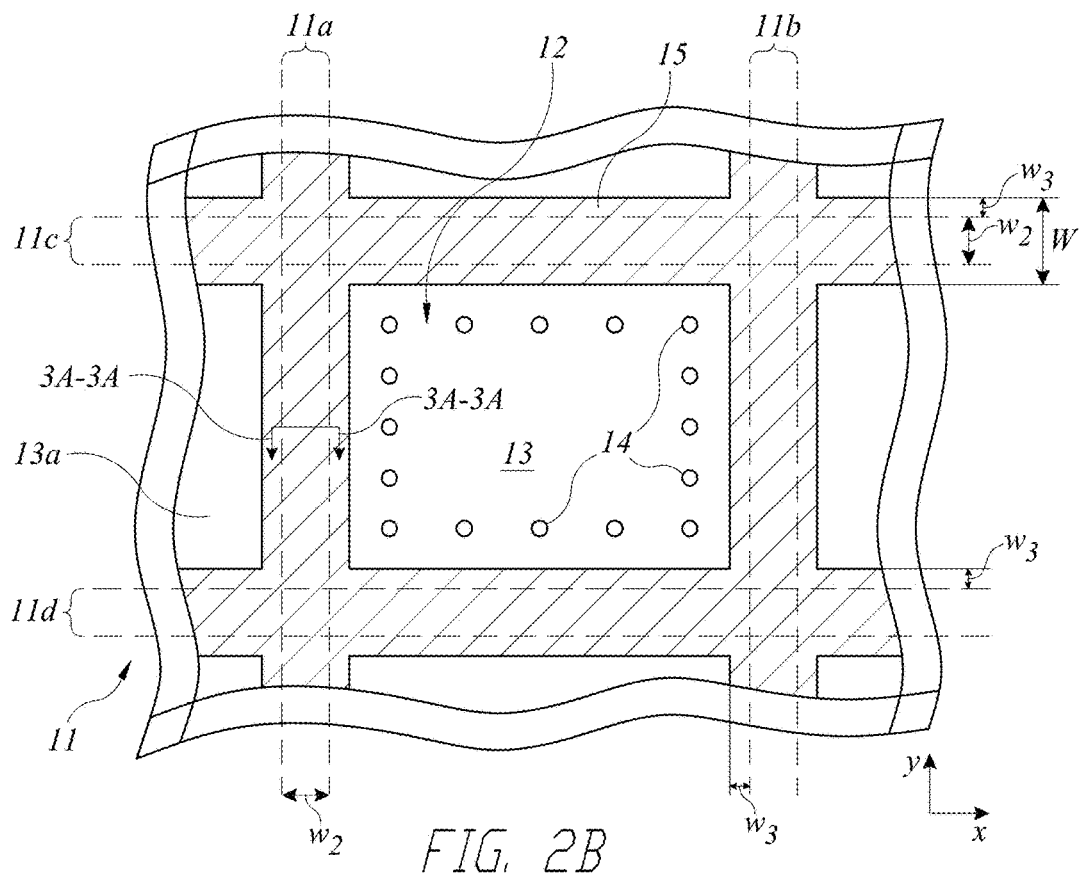
FIG. 2B is an enlarged schematic top view of the substrate of FIG. 2A with integrated device cells.
Figure 2A:
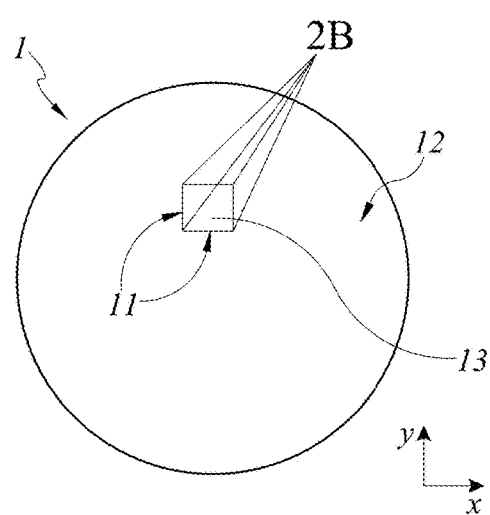
FIG. 2A is a schematic top plan view of a substrate having a plurality of integrated device cells.

FIG. 2B is a schematic top plan view of an example integrated device cell 13, according to one embodiment. The device cell 13 can be delimited or defined at least in part by saw streets 11a, 11b, 11c, and 11d. Each saw street 11a-11d can have a width $w_2$ representing the approximate width of the blade used to cut along the saw street 11a-11d. As shown in FIG. 2B, a plurality of bond pads 14 may be formed on the first side 12 of the device cell 13. The bond pads 14 can be configured to provide electrical communication between the device die and external components, such as a packaging substrate. For example, testing probes can contact bond pads 14 before or after singulation, and bonding wires can electrically connect the bond pads 14 to a packaging substrate after singulation in some embodiments. In other embodiments, solder or other adhesive can be applied between the bond pads 14 and the packaging substrate.

As explained above, in various arrangements, it can be desirable to provide an exposed metal structure on the substrate 1 during processing, e.g., to prevent corrosion when the bond pads are exposed to water. The illustrated embodiment in FIG. 2B illustrates the exposed metal structure, which includes the metal strips 15 disposed along the saw streets 11a-11d. In FIG. 2B, the metal strips 15 are illustrated as s continuous metal strips about the periphery of the device cell 13, but it should be understood that in other embodiments the exposed metal structure within the saw streets 11a-11d may be patterned and/or discontinuous. In the embodiment of FIG. 2B, the metal strips 15 are shown extending along the saw streets 11a-11d. As illustrated, for example, the metal strips 15 can be wider than the saw streets 11a-11d such that the saw streets 11a-11d are disposed laterally within the metal strips 15. As shown in FIG. 2B, for example, the overall width W of the metal strip 15 can be defined by the width $w_2$ of the saw blade and the widths $w_3$ of the leftover strips, such that $W=w_2+2w_3$. It will be understood that $w_3$ can represent an average width, since the leftover strips need not be identical after saw singulation. The overall width W of the strip 15 and the width $w_2$ of the saw blade can be selected such that the leftover strip width $w_3$ is sufficiently large so as to avoid delamination of the metal strip 15 from the substrate. In various embodiments, for example, it may be desirable to ensure that the leftover strip width $w_3$ along each cell is at least 10 microns, or at least 25 microns. Thus, a minimum leftover strip width $w_3$ can be determined so as to avoid delamination of the metal strip 15, and the overall width W of the saw street 11 and the width $w_2$ of the blade can be selected. For example, for a minimum leftover strip width $w_3$ of 25 microns and a blade width $w_2$ of 30 microns, the minimum overall strip width W of the saw street 11 can be 80 microns (i.e., 2 times 25 microns, plus 30 microns).

The metal strips 15 can comprise aluminum in various arrangements. In other embodiments, the metal strips 15 can be any other suitable type of metal. Because, in some embodiments, having a metal layer on the first side 12 can advantageously act as a sacrificial anode to prevent corrosion of the bond pads, it may be desirable to expose metal in the saw streets 11 as much as possible. However, the metal strips 15 can be covered partially in some arrangements. For example, in some embodiments, there can be a covering layer of material different from the metal strip 15. Before singulation, the covering layer can be removed to leave portions of the extra layer, thus, exposing majority of the metal strips 15 on the first side 12. In the illustrated embodiments, the metal structure (e.g., metal strip 15) may be disposed at or near the active surface of the device cells 13 (e.g., exposed on the active surface). In some embodiments, the bond pads 14 are also aluminum, although any suitable metal may be used as a sacrificial anode during wet sawing to protect the bond pads 14 from corrosion.

The embodiments disclosed herein can beneficially reduce or eliminate stringers from side surfaces of the device cells 13, 13a, such that the lateral side edges of the die are substantially free of stringers. For example, the embodiments disclosed herein can reduce the length of stringers 35 to less than 100 microns, less than 90 microns, less than 80 microns, or less than 70 microns. In some embodiments, the methods disclosed herein can reduce the length of stringers 35 to within a range of 0.1 microns to 100 microns, within a range of 0.5 microns to 100 microns, within a range of 1 micron to 100 microns, within a range of 1 micron to 90 microns, within a range of 1 micron to 80 microns, within a range of 1 micron to 70 microns, or within a range of 5 microns to 70 microns.

Figure 3A:
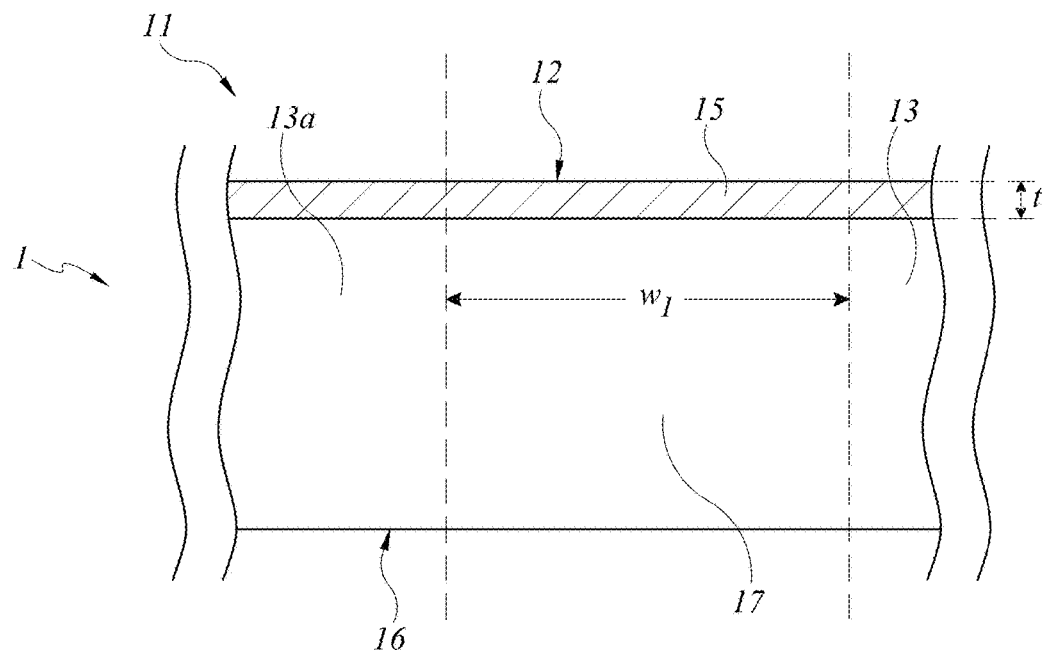
FIG. 3A is a schematic side sectional view of the device cells of FIG. 2B before a sawing process.
Figure 3B:
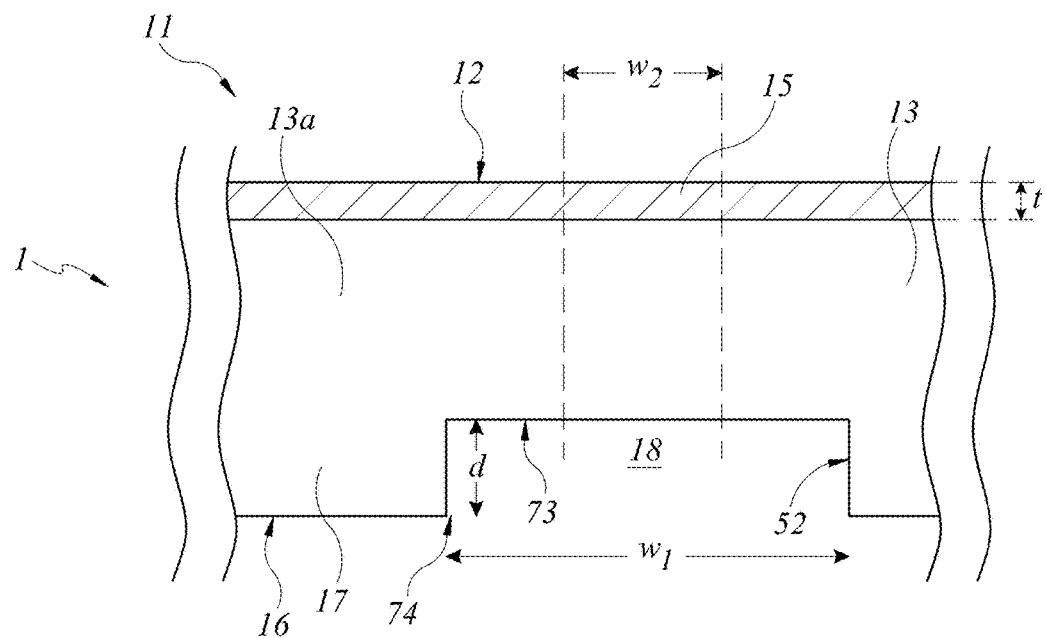
FIG. 3B is a schematic side sectional view of the device cells of FIG. 3A after a first sawing process.
Figure 3C:
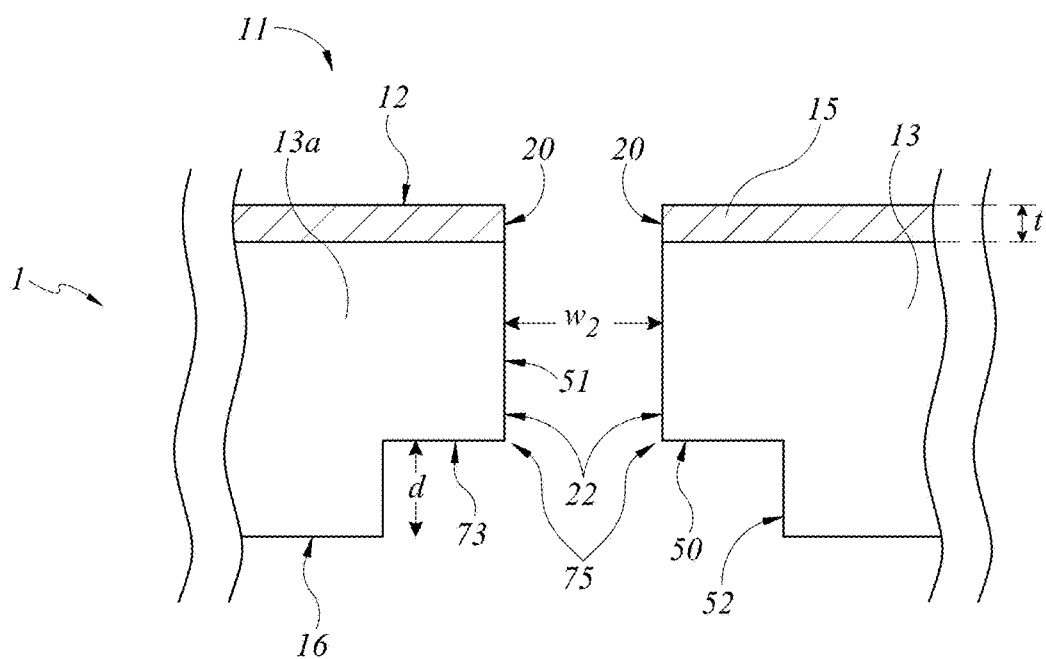
FIG. 3C is a schematic side sectional view of the device cells of FIG. 3B after a second sawing process, according to some embodiments.

FIGS. 3A-3C are schematic side cross-sectional views of the device cell 13 and a neighboring device cell 13a during various stages of a semiconductor processing method. In FIG. 3A, the device cell 13 and the neighboring device cell 13a are shown separated by the location of a saw street 11 prior to singulation. The metal strip 15 can extend across and lie at least partially within the saw street 11. In FIG. 3A, the metal strip 15 is disposed on an exterior or outermost surface of the first side 12 of the substrate 1, and may lie along a periphery of the device cell 13. As previously noted, the first side 12 can represent the front or active side of the wafer in which devices are formed. For example, the metal strip 15 can be disposed over a bulk semiconductor region 17 (e.g., a semiconductor base substrate) of the substrate 1. In FIG. 3A, a first width $w_1$ along the saw street 11 may be representative of a first saw cut (see FIG. 3B). The substrate 1 may be adhered to a tape for singulation. For example, in FIG. 3A, the first side 12 of the substrate 1 may be adhered to the tape (not shown) during singulation.

Turning to FIG. 3B, the first saw cut can be made partially through the thickness of the substrate 1 from the second side 16 of the substrate 1, i.e., such that the saw blade initially contacts and cuts through the second side 16. The second side 16 can represent the back or rear side of the wafer. The first cut of FIG. 3B can create an entrance marking at or near a corner 74 between the second side 16 and a first side edge 52, with the entrance marking being representative of the saw blade passing through the second side 16. The first saw cut can be made at a depth d to define a recess 18 or groove through the second side 16. Along a floor 73 of the recess 18, the saw blade can create terminal markings representative of the termination of the first saw cut at the depth d. The depth d can be any suitable depth, but is preferably less than half the thickness of the wafer, or less than a third of the thickness of the wafer, such as not more than one quarter of the thickness of the wafer. In some embodiments, the depth can be in a range of 10% to 50%, 20% to 40%, and/or 25% to 50% of the thickness of the wafer. For example, in some embodiments, the depth d of the first saw cut can be in a range of 5 microns to 150 microns, or more particularly, in a range of 10 microns to 95 microns. In some embodiments, the depth d can be in a range of 25 microns to 90 microns, e.g., in a range of 50 microns to 90 microns. It should be understood that the depth d of the first saw cut can be as large as suitable for the particular substrate being diced. Although the first saw cut is shown in FIGS. 3B-3C as having a rectangular shape, it should be understood that the first saw cut may have any other suitable shape, such as having sloped sidewalls.

As shown in FIGS. 3B-3C, the saw street 11a can define a second saw cut having a second width $w_2$, which may differ from the first width $w_1$. In the illustrated embodiment, the second width $w_2$ for the second saw cut can be the same or less than the first width $w_1$ of the first saw cut. In some embodiments, the substrate 1 can be flipped over, and tape (not shown) can be applied to the second side 16 of the substrate 1.

In FIG. 3C, the second saw cut can be made from the first side 12 of the substrate such that the saw blade initially contacts and cuts from the first side 12 toward the second side 16. The second saw cut can create entrance markings at or near the first side 12 of the substrate with the entrance markings being representative of the saw blade passing through the first side 16. In some embodiments, an imaging system (such as an infrared camera) can be used to align the saw blade with the recess 18 defined in FIG. 3B. The second saw cut can pass completely through the remaining thickness of the substrate 1 in the saw street 11a to physically separate the device cell 13 and the neighboring device cell 13A. The second saw cut can also create exit markings along a second side edge 51 (e.g., second saw markings). As explained herein, the markings along the second side edge 51 and the markings along the floor 73 of the recess 18 can define side saw markings 75 representative of a dual saw cut in which a first cut passes partially through the second side 16 and a second cut passes through the first side 12 (which can comprise metal) and the remainder of the thickness of the substrate.

Thus, in the illustrated embodiment, the saw blade only cuts through and passes the metal strip 15 in the saw street 11a a single time and in a direction from the outer surface of the metal toward the bulk of the substrate, to cleanly cut through the metal strip 15 and the bulk semiconductor material 17. In FIG. 3C, therefore, the second saw cut can leave a smooth metallic edge 20 and a smooth semiconductor edge 22 after singulation. Because there was only a single saw cut through the metal (e.g., the second saw cut), no or few stringers are present along the die edges. Thus, the metallic edge 20 and semiconductor edge 22 can have sawn surfaces that are substantially free of metallic stringers. The side edges 20, 22 can have a profile characteristic of being sawn by two cuts from opposite sides of the substrate, as evidenced, for example, by the side saw markings 75. It should be appreciated that the metallic edge 20 and the semiconductor edge 22 may have striations or other markings that indicate mechanical sawing (as opposed to etching or laser sawing), but the metallic edge 20 may be free from metallic strips that hang off or dangle from the edge of the singulated die, or any stringers that remain may have sufficiently small lengths, e.g., less than 100 microns, less than 90 microns, less than 80 microns, or less than 70 microns. In some embodiments, the methods disclosed herein can reduce the length of stringers 35 to within a range of 0.1 microns to 100 microns, within a range of 0.5 microns to 100 microns, within a range of 1 micron to 100 microns, within a range of 1 micron to 90 microns, within a range of 1 micron to 80 microns, within a range of 1 micron to 70 microns, or within a range of 5 microns to 70 microns. Although the second saw cut as seen in FIG. 3C has a rectangular shape, it should be understood that the second saw cut may have any other suitable shape, such as having sloped sidewall surfaces.

Moreover, as shown in FIG. 3C, the second side edge 51 (e.g., a second sawing surface) can extend substantially flush with the sawed surface of the metallic edge 20. The first side edge 52 can represent the first saw cut and can be recessed inwardly from the metallic edge 20 and the second side edge 51 of the semiconductor edge 22. A lateral portion 50 (e.g., a portion of the floor 73 of the recess 18) can extend laterally from the second side edge 51 to the first side edge 52. Note that the extent of the lateral portion 50 in FIG. 3C, which is not to scale, is exaggerated for purposes of illustration.

As explained above, the side edges 20, 22 can have a profile characteristic of being sawn by two cuts from opposite sides of the substrate, as evidenced, for example, by the side saw markings 75. In particular, after the second saw cut, the side saw marking 75 can be disposed on the semiconductor edge 22. In some embodiments, the side saw marking 75 can comprise a transition region, a discontinuity, a step and/or an unevenness between the first side edge 52 (representative of a first saw cut) and the second side edge 51 (representative of the second saw cut). For example, in the embodiment of FIG. 3C, the side saw marking 75 can represent a transition or discontinuity in the surface of the semiconductor edge 22, in the form of an abrupt change in profile between the second side edge 51 and the floor 73 of the recess 18. For example, in FIG. 3C, a lateral portion 50 of the floor 73 can represent the transition or discontinuity indicative of multiple saw cuts from opposing sides of the substrate. Moreover, since the saw cuts are being made across a wafer, these markings 75 can extend across the entire semiconductor side edge 22, e.g., along an entire width of the singulated device die.

As explained herein, although the transition region is illustrated as being a horizontal lateral portion 50 in FIG. 3C, it should be appreciated that transition region can be angled, curved, uneven, or otherwise non-linear or non-horizontal. The first side edge 52 can be defined by the wider first saw cut through a portion of the second or back side 16 of the substrate 1. The second side edge 51 and the metallic edge 20 can be defined by the relatively narrower second saw cut through the first or top side 12 of the substrate 1. Accordingly, the integrated device die 2 can have different widths above and below the side saw marking 75 (e.g., the transition region). For example, in the illustrated embodiment, the integrated device die 2 can be narrower at the first side edge 52 as compared to at the second side edge 51. Thus, the metallic side edge 20 and the second side edge 51 can comprise first markings from a saw pass along a first direction (e.g., from the first side 12 towards the second side 16). The first side edge 52 can comprise second markings from a saw pass along a second direction opposite the first direction (e.g., from the second side 16 towards the first side 12). The junction between the first and second saw markings can define the side saw markings 75 indicative of the dual-saw dicing procedures disclosed herein. The skilled artisan will appreciate that the surfaces of the second side edge 51 near the first or front side 12 and of the first side edge 52 near the second or back side 16 can both be surfaces characteristic of entrance cuts of saws. In contrast, the surface of the semiconductor edge 22 near the lateral portion 50 is a surface characteristic of an exit cut. The metallic edge 20 and the semiconductor edge 22 may not be etched.

Thus, when the singulated integrated device dies are packaged into a device package, a metal structure, e.g., a strip of metal (such as the strip 15), can be disposed on a side edge of the semiconductor substrate, e.g., along a side edge of the device cell 13 after singulation. In some embodiments, the metal structure can be disposed at or near the active surface of the device cell 13 (e.g., at or near the active surface of the singulated device die). In various embodiments, the metal structure (which can comprise the metal strip 15) can extend about the perimeter of the singulated integrated device die. The strip of metal can be disposed on an outermost or exterior surface of the active side 12 of the integrated device die, and can have an exposed side edge 20 that is substantially or completely free of stringers. In various embodiments, for example, the methods disclosed herein can reduce the length of stringers 35 to less than 100 microns, less than 90 microns, less than 80 microns, or less than 70 microns. In some embodiments, the methods disclosed herein can reduce the length of stringers 35 to within a range of 0.1 microns to 100 microns, within a range of 0.5 microns to 100 microns, within a range of 1 micron to 100 microns, within a range of 1 micron to 90 microns, within a range of 1 micron to 80 microns, within a range of 1 micron to 70 microns, or within a range of 5 microns to 70 microns.

After singulation, the metal strip 15 has the strip width $w_3$ as shown in FIG. 2B and a strip thickness t as shown in FIGS. 3A-3C. The strip thickness t can be any suitable thickness. Various factors (e.g., material characteristics of the metal strip 15, mechanical properties of the saw blade, adhesiveness between the substrate and the metal strip 15, the strip thickness t, and the humidity of a fabrication site) can affect the determination of the desired minimum strip width $w_3$ so as to avoid delamination of the strip 15 from the substrate. In some embodiments, the strip width $w_3$ can be at least 5 microns, at least 10 microns. In various embodiments, the strip width $w_3$ can be in a range of 5 microns to 25 microns, or more particularly 10 microns to 25 microns. Different device cells 13, 13A, can have different strip widths $w_3$. Further, the strip widths $w_3$ can vary at different regions of a single device cell 13. For example, the strip widths $w_3$ along the saw street 11a can be different from the strip widths $w_3$ along the saw streets 11b, 11c, 11d. Similarly, various factors (e.g., material characteristics of the metal strip 15, mechanical properties of the saw blade, adhesiveness between the device cell 13 and the metal strip 15, the desired strip width $w_3$, and the humidity of a fabrication site) can affect the determination of the desired strip thickness t. In some embodiments, for a metal (such as aluminum) used on a silicon wafer, the strip thickness t can beneficially be at least 0.7 microns, at least 0.9 microns, or at least 1 micron so as to reduce risk of stringers 35. For example, the strip thickness t can be in a range of 0.7 microns to 2.5 microns, or more particularly, in a range of 1 microns to 2.5 microns. In some embodiments, the strip thickness t of 1 micron or less can create larger and/or more frequent stringers 35 than a strip thickness t of greater than 1 micron. However, the above mentioned factors can affect these numbers. For example, some metal compositions may allow the strip thickness t to be smaller than a certain thickness as the strip width $w_3$ becomes greater without creating stringers 35.

Figure 3D:
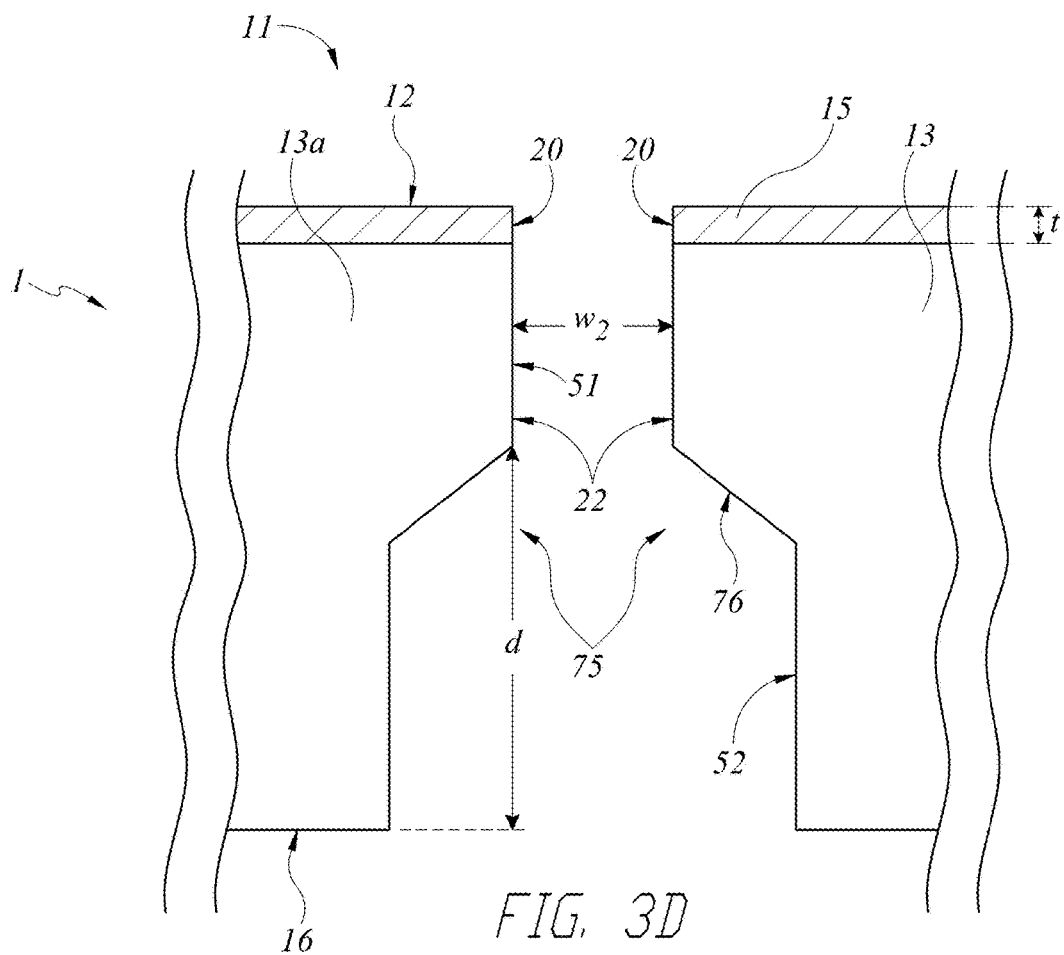
FIG. 3D is a schematic side sectional view of device cells after a second sawing process, according to another embodiment.

FIG. 3D shows a schematic side cross-sectional view of the device cell 13 and a neighboring device cell 13a after singulation, according to another embodiment. Unless otherwise noted, reference numerals in FIG. 3D may represent components similar to or the same as like numbered components of FIG. 3C. In FIG. 3D, for example, the first saw cut through the second side 16 can create a transition region comprising a slanted surface 76 comprising an angled or uneven surface and a first side edge 52 representative of a first saw cut (e.g., a backside saw cut). A second saw cut can be made through the first side 12 through the remaining portion of the substrate 1, as explained above. Thus in FIG. 3D, the first saw cut can terminate in a slanted or uneven profile. As with FIG. 3C, the slanted surface 76 can create a lateral offset between the first and second side edges 52. In FIG. 3D, the first saw cut through the second side 16 and the second saw cut through the first side 12 create side saw markings 75 which can represent a transition region or a discontinuity representative of the dual-side saw processes. Although FIG. 3D illustrates a transition region comprising a slanted surface 76, in other embodiments, the markings 75 or transition region can comprise other uneven, discontinuous, or abrupt changes in side surface profile.

FIG. 3E is a scanning electron micrograph illustrating a perspective side view of an integrated device die 2 formed by a two-sided sawing process. FIG. 3F is a scanning electron micrograph illustrating a magnified side view of the integrated device die 2 of FIG. 3E. The semiconductor edge 22 on the device die 2 can have a side saw marking 75 between the first side edge 52 and the second side edge 51. In the illustrated example depicted in FIG. 3F, the side saw marking 75 has a sloped edge, as shown in the left side of the image of FIG. 3F. The sloped edge may be similar to that illustrated in FIG. 3D. However, it should be understood that depending on a type of saw used for singulating the device die 2, the profile along the side edge may vary. As explained above, the saw marking 75 can indicate a transition or discontinuity representative of first and second saw cuts passing along opposite directions (e.g., a backside saw cut and a topside saw cut). As shown in FIGS. 3F-3G, beneficially, the metallic edge 20 can be substantially free of stringers.

Figure 4A:
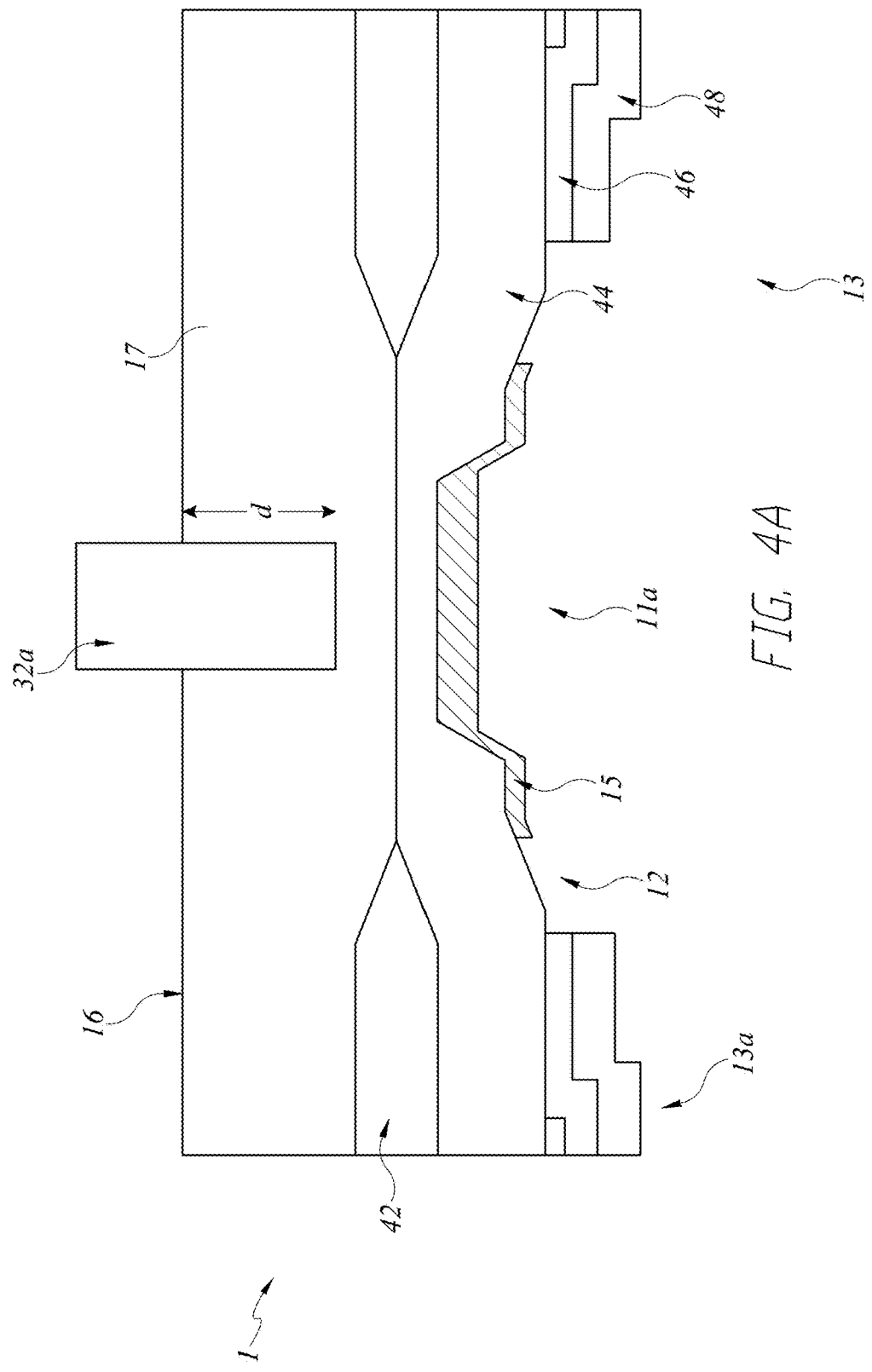
FIG. 4A is a schematic side cross-sectional view illustrating additional structures of the device dies of FIG. 2B during the first sawing process.
Figure 4B:
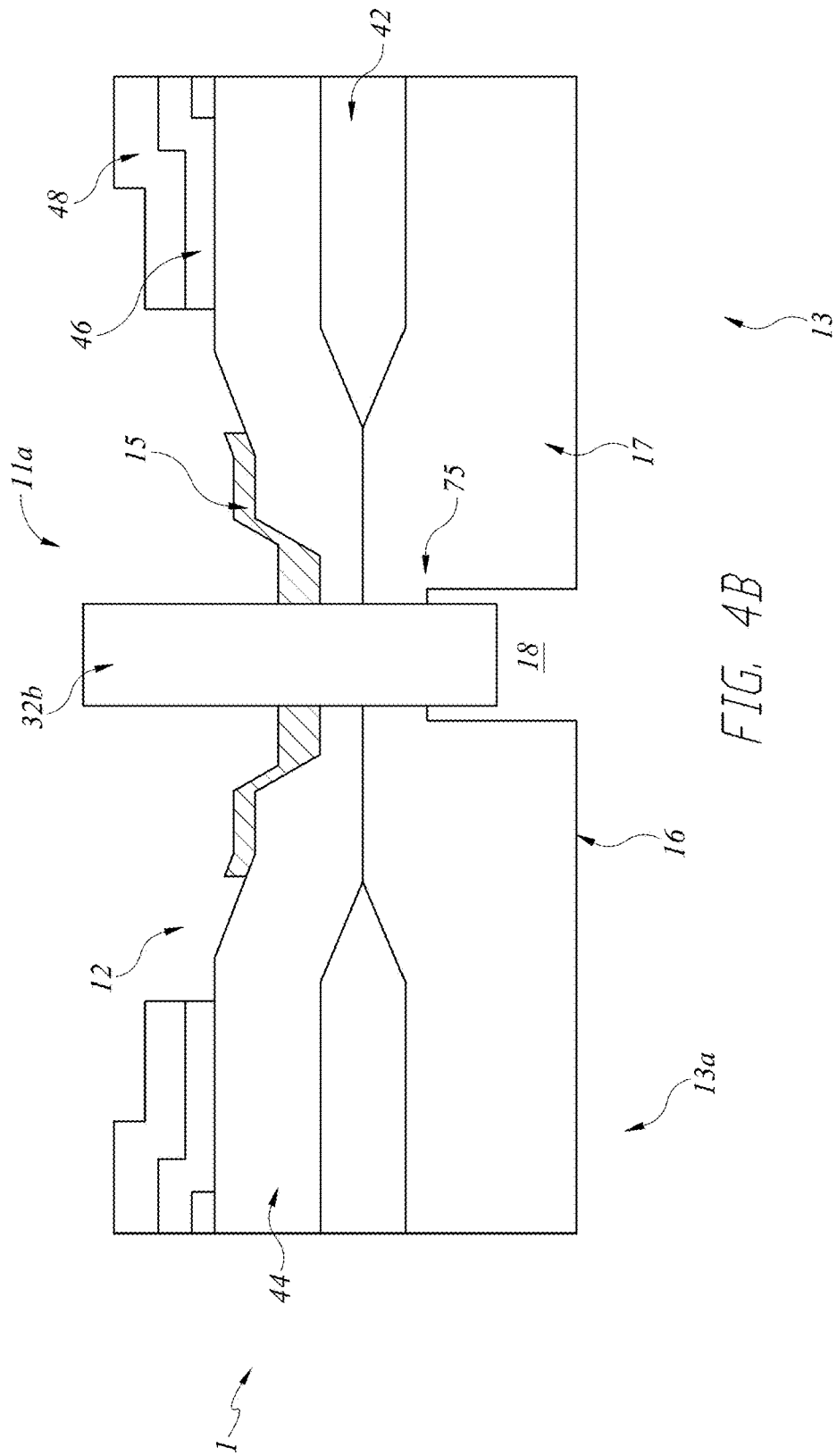
FIG. 4B is a schematic side cross-sectional view illustrating additional structures of the device dies of FIG. 2B during the second sawing process.

FIG. 4A is a schematic side cross-sectional view illustrating additional structural features of two adjacent device cells 13, 13A during the first saw cut through a portion of the second side 16 of the substrate 1. The substrate 1 described herein can include deposited layers in addition to the bulk semiconductor material (e.g., silicon). FIG. 4B is a schematic side cross-sectional view illustrating additional structural features of two adjacent device cells 13, 13A during the second saw cut through the first side 12 of the substrate 1. As shown in FIGS. 4A and 4B, the metal strip 15 can be disposed along the saw street 11a, and can extend across the width of the saw street 11a. Moreover, as shown in FIGS. 4A-4B, the metal strip 15 can be formed by two metal layer depositions, a first metal and a second metal. The first and second metals can be the same metal or different metals. The first and/or second metal can comprise, for example, aluminum and copper. Also shown in FIGS. 4A-4B are a field oxide layer 42 (in the illustrated embodiment a thermal oxide formed by local oxidation) disposed over the bulk semiconductor material 17 (which is silicon in the illustrated example) between the bulk semiconductor material 17 and the interlayer dielectric 44. A passivation layer 46 can be disposed over the interlayer dielectric 44, and a polymer protective layer 48 (e.g., polyimide) can be disposed over the passivation layer 46.

In some embodiments, the metal strip 15 with two layer metal depositions can be advantageous. For example, the two layer metal deposition can increase the strength of the metal strip 15, where the second saw cut is made, as compared with a single layer metal deposition, which may, in turn, reduce and/or eliminate the chance of causing the stringer 35.

In FIG. 4A, as explained above, a first saw blade 32a can cut from the second side 16 of the substrate 1 only partially through the substrate 1 to a depth d. As shown in FIG. 4B, the first cut can define the recess 18 in the second side 16 of the substrate 1. In FIG. 4B, the substrate 1 can be flipped over and may be mounted such that the second side 16 is adhered to a tape or other adhesive. A second saw blade 32b (which may be narrower than the first blade 32a) can cut from the first side 12 of the substrate 1 to remove the portion of the substrate 1 above the groove 18 and to physically separate the neighboring device cells 13, 13A. In the illustrated embodiment, the second saw blade 32b is narrower than the first saw blade 32a. In other embodiments, the first and second saw blades 32a, 32b may have about the same width. The widths of the first and second saw blades can differ. As with the embodiments described above, the embodiment of FIGS. 4A-4B can beneficially singulate the device dies with substantially no metal stringers along the edges of the metal on the side of the die. Moreover, as explained above, side saw markings (such as the saw markings 75) can represent a dual singulation process in which a first saw cut was made along a first side (e.g., back side) of the wafer and a second saw cut was made along a second side (e.g., front side) of the wafer.

Although the embodiment illustrated in FIGS. 3A-4B utilized a first partial saw cut from the second side 16 and a second complete saw cut from the first side 12, in other embodiments, the first partial saw cut can be made from the first side 12 for the depth d, and the second complete saw cut can be made from the second side 16. The second saw cut cuts through a remaining thickness of the substrate 1. Any suitable saw widths may be used for the first and second cuts, although minimal remaining metal strip widths after cutting from the first side has advantages in minimizing stringers. In the illustrated embodiment, the first partial cut is made with a blade that is wider than the blade used for the complete saw cut. In other embodiments, the first partial saw cut can be made with a blade that is narrower than (or the same thickness as) the blade used to make the second complete saw cut.

Although this various embodiments have been disclosed herein, it will be understood by those skilled in the art that the present disclosure extends beyond the specifically disclosed embodiments to other alternative embodiments and/or uses of the embodiments and obvious modifications and equivalents thereof. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the description. It should be understood that various features and aspects of the disclosed embodiments can be combined with, or substituted for, one another in order to form varying modes of the disclosed features.

What is claimed is:

1. An integrated device die comprising:
    a semiconductor substrate comprising active circuitry at or near an active side of the integrated device die; and
    a metal structure disposed continuously along a side edge of the semiconductor substrate at or near the active side of the integrated device die, the side edge comprising a first side edge and a second side edge,
    wherein the side edge comprises a side saw marking defining a transition region between the first side edge and the second side edge.

2. A method for forming the integrated device die of claim 1 from the semiconductor substrate having a first integrated device cell and a second integrated device cell, the first and second integrated device cells delimited by a saw street, the saw street comprising metal, the method comprising:
    partially sawing through the semiconductor substrate at a first depth along the saw street from one side of the semiconductor substrate; and
    sawing through a remaining thickness of the semiconductor substrate from an opposite side of the semiconductor substrate along the saw street to physically separate the first integrated device cell and the second integrated device cell.

3. The method of claim 1, wherein partially sawing comprises partially sawing through the semiconductor substrate from a back side of the semiconductor substrate, and wherein sawing through the remaining thickness comprises sawing from a front side of the semiconductor substrate having active circuit components.

4. The method of claim 3, wherein the metal is formed at the front side of the semiconductor substrate.

5. The method of claim 4, wherein the metal comprises a sacrificial anode for protecting bond pads during wet sawing.

6. The method of claim 1, wherein side edges of the integrated device die include the metal structure.

7. The method of claim 6, wherein the side edges have a profile characteristic of being sawn by two cuts from opposite sides of the semiconductor substrate.

8. The method of claim 1, wherein the first depth is less than 50% of a thickness of the semiconductor substrate.

9. The method of claim 8, wherein the first depth is in a range of 5 microns to 150 microns.

10. The method of claim 4, wherein the metal has a strip width on the front side in a range of 5 microns to 25 microns after the sawing through the remaining thickness.

11. The method of claim 1, wherein the metal comprises aluminum.

12. The method of claim 1, further comprising sawing through the metal only once.

13. The method of claim 1, further comprising sawing along additional saw streets to singulate the first and second integrated device cells into corresponding first and second integrated device dies.

14. The integrated device die of claim 1, wherein the metal structure comprises a metal strip, the metal strip having a strip width in a range of 5 microns to 25 microns and a thickness measured from the active side toward a backside opposite the active side in a range of 0.7 microns to 2.5 microns.

15. The integrated device die of claim 1, wherein the transition region is indicative of a profile characteristic of being sawed from opposite sides of the substrate.

16. The integrated device die of claim 1, wherein the first side edge extends from a back side of the semiconductor substrate and the second side edge extends from the active side of the integrated device die, the transition region comprising a discontinuity between the first and second side edges.

17. The integrated device die of claim 16, wherein the discontinuity comprises a lateral or slanted surface extending between the first and second edges, the first and second edges laterally offset from one another.

18. The integrated device die of claim 17, wherein the second side edge comprises a flush portion extending substantially flush with the metallic structure.

19. The integrated device die of claim 1, wherein the side saw marking extends along an entire width of the integrated device die.

20. The integrated device die of claim 1, wherein the integrated device die has different widths above and below the transition region.

* * * * *

UNITED STATES PATENT AND TRADEMARK OFFICE
CERTIFICATE OF CORRECTION

PATENT NO. : 10,242,912 B2  
APPLICATION NO. : 15/625122  
DATED : March 26, 2019  
INVENTOR(S) : Ventola et al.

Page 1 of 1

It is certified that error appears in the above-identified patent and that said Letters Patent is hereby corrected as shown below:

In the Claims

Column 10, Line 50, in Claim 3, change "claim 1," to --claim 2,--.

Column 10, Line 61, in Claim 6, change "claim 1," to --claim 2,--.

Column 10, Line 66, in Claim 8, change "claim 1," to --claim 2,--.

Column 11, Line 5, in Claim 10, change "thickness." to --thickness, and a thickness measured from the front side towards the back side in a range of 0.7 microns to 2.5 microns.--.

Column 11, Line 6, in Claim 11, change "claim 1," to --claim 2,--.

Column 11, Line 8, in Claim 12, change "claim 1," to --claim 2,--.

Column 11, Line 10 (approx.), in Claim 13, change "claim 1," to --claim 2,--.

Signed and Sealed this  
Twenty-fifth Day of June, 2019

Andrei Iancu  
*Director of the United States Patent and Trademark Office*